US010327061B2

(12) United States Patent
Doy

(10) Patent No.: US 10,327,061 B2
(45) Date of Patent: *Jun. 18, 2019

(54) SIGNAL LIMIT BASED ON MEASURED RADIATOR EXCURSION

(71) Applicant: Sonos, Inc., Santa Barbara, CA (US)

(72) Inventor: Tony Doy, Santa Barbara, CA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/972,424

(22) Filed: May 7, 2018

(65) Prior Publication Data

US 2018/0324521 A1 Nov. 8, 2018

Related U.S. Application Data

(63) Continuation of application No. 15/287,324, filed on Oct. 6, 2016, now Pat. No. 9,967,655.

(51) Int. Cl.

| | |
|---|---|
| ***H03G 11/00*** | (2006.01) |
| ***H04R 1/28*** | (2006.01) |
| ***H04R 3/00*** | (2006.01) |
| ***H04R 29/00*** | (2006.01) |
| *H04R 27/00* | (2006.01) |

(52) U.S. Cl.

CPC ........... *H04R 1/2834* (2013.01); *H04R 3/007* (2013.01); *H04R 29/001* (2013.01); *H04R 27/00* (2013.01)

(58) Field of Classification Search

CPC combination set(s) only.
See application file for complete search history.

(56) References Cited

U.S. PATENT DOCUMENTS

| | | | |
|---|---|---|---|
| 5,440,644 | A | 8/1995 | Farinelli et al. |
| 5,761,320 | A | 6/1998 | Farinelli et al. |
| 5,923,902 | A | 7/1999 | Inagaki |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |

(Continued)

FOREIGN PATENT DOCUMENTS

| | | | |
|---|---|---|---|
| EP | 1389853 | A1 | 2/2004 |
| WO | 200153994 | | 7/2001 |
| WO | 2003093950 | A2 | 11/2003 |

OTHER PUBLICATIONS

AudioTron Quick Start Guide, Version 1.0, Mar. 2001, 24 pages.

(Continued)

*Primary Examiner* — Amir H Etesam
(74) *Attorney, Agent, or Firm* — McDonnell Boehnen Hulbert & Berghoff LLP

(57) ABSTRACT

Example techniques may involve controlling a passive radiator. An implementation may include a device playing back an input signal representing audio content via one or more active speakers. The device measures excursion of the passive radiator when the input signal is played back via the one or more active speakers. The device limits excursion of the passive radiator to less than an excursion limit when certain input causes the passive radiator to move beyond the excursion limit.

20 Claims, 8 Drawing Sheets

(56) References Cited

U.S. PATENT DOCUMENTS

| | | | | |
|---|---|---|---|---|
| 6,757,517 | B2 | 6/2004 | Chang | |
| 6,778,869 | B2 | 8/2004 | Champion | |
| 7,130,608 | B2 | 10/2006 | Hollstrom et al. | |
| 7,130,616 | B2 | 10/2006 | Janik | |
| 7,143,939 | B2 | 12/2006 | Henzerling | |
| 7,236,773 | B2 | 6/2007 | Thomas | |
| 7,295,548 | B2 | 11/2007 | Blank et al. | |
| 7,391,791 | B2 | 6/2008 | Balassanian et al. | |
| 7,483,538 | B2 | 1/2009 | McCarty et al. | |
| 7,571,014 | B1 | 8/2009 | Lambourne et al. | |
| 7,630,501 | B2 | 12/2009 | Blank et al. | |
| 7,643,894 | B2 | 1/2010 | Braithwaite et al. | |
| 7,657,910 | B1 | 2/2010 | McAulay et al. | |
| 7,853,341 | B2 | 12/2010 | McCarty et al. | |
| 7,987,294 | B2 | 7/2011 | Bryce et al. | |
| 8,014,423 | B2 | 9/2011 | Thaler et al. | |
| 8,045,952 | B2 | 10/2011 | Qureshey et al. | |
| 8,103,009 | B2 | 1/2012 | McCarty et al. | |
| 8,234,395 | B2 | 7/2012 | Millington et al. | |
| 8,483,853 | B1 | 7/2013 | Lambourne | |
| 8,942,252 | B2 | 1/2015 | Balassanian et al. | |
| 9,485,576 | B2 * | 11/2016 | Gautama | H04R 3/002 |
| 9,967,655 | B2 * | 5/2018 | Doy | H04R 1/2834 |
| 2001/0042107 | A1 | 11/2001 | Palm | |
| 2002/0022453 | A1 | 2/2002 | Balog et al. | |
| 2002/0026442 | A1 | 2/2002 | Lipscomb et al. | |
| 2002/0124097 | A1 | 9/2002 | Isely et al. | |
| 2003/0157951 | A1 | 8/2003 | Hasty | |
| 2004/0024478 | A1 | 2/2004 | Hans et al. | |
| 2007/0142944 | A1 | 6/2007 | Goldberg et al. | |
| 2012/0106750 | A1 * | 5/2012 | Thormundsson | H04R 3/007 381/71.12 |
| 2013/0287228 | A1 | 10/2013 | Kallai et al. | |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action dated Nov. 16, 2017, issued in connection with U.S. Appl. No. 15/287,324, filed Oct. 6, 2016, 4 pages.
Notice of Allowance dated Jan. 2, 2018, issued in connection with U.S. Appl. No. 15/287,324, filed Oct. 6, 2016, 9 pages.
Palm, Inc., "Handbook for the Palm VII Handheld," May 2000, 311 pages.
Presentations at WinHEC 2000, May 2000, 138 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

SIGNAL LIMIT BASED ON MEASURED RADIATOR EXCURSION

CROSS REFERENCE TO RELATED APPLICATIONS

This application claims priority under 35 U.S.C. § 120 to, and is a continuation of, U.S. patent application Ser. No. 15/287,324, filed on Oct. 6, 2016, entitled "Audio Playback Settings for Voice Interaction," the contents of which are incorporated by reference herein in their entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
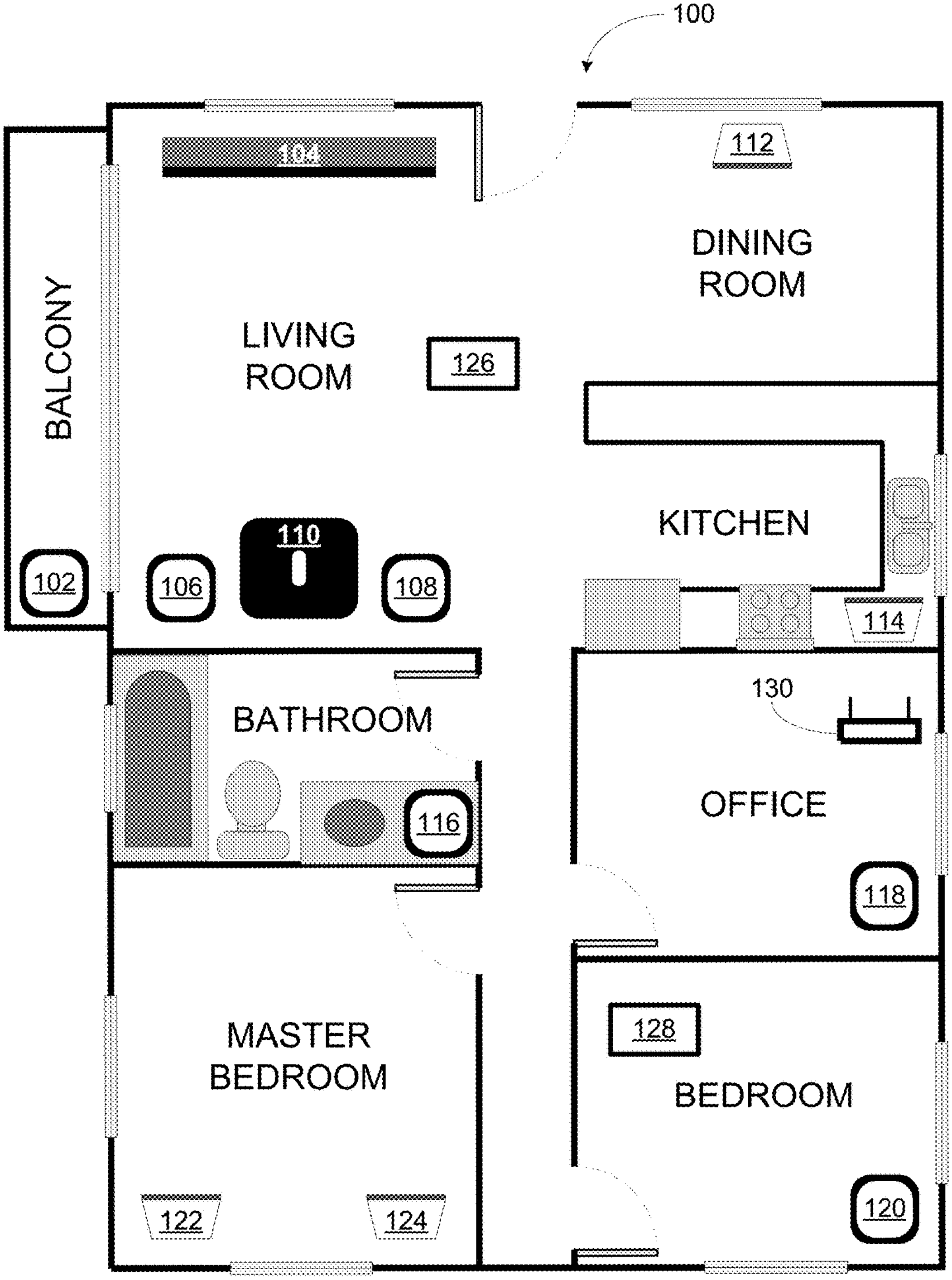
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

An example playback device may include one or more speakers (a.k.a. active drivers) and a passive radiator in a sealed enclosure. The speakers may include respective voice coils and magnetic assemblies to drive a suspended cone for audio playback. In contrast, the passive radiator includes a suspended cone (or surface) and typically an added weight or mass, but is not driven by a voice coil and magnetic assembly. Rather, playback of audio content using the one or more speakers displaces air in the sealed enclosure thereby causing the passive radiator to move as well.

Positive or negative excursion of a passive radiator is approximately linearly related to the sum of excursion of speakers in the sealed enclosure. This behavior is frequency dependent. Some passive radiators are arranged to have maximum excursion at its resonant frequency so as to extend the low frequency response of the system. Active speakers move in proportion to the voltage applied to their voice coil. As such, the excursion of a passive radiator in an enclosure is linearly related to voltage applied to active speakers in that enclosure.

However, the relationship between the voltage applied to one or more active drivers and excursion of a passive driver is typically only linear up to the positive (+d) and negative (−d) excursion limits. These are physical limits imposed by the suspension of the passive radiator. Like an active speaker, a passive radiator includes a cone suspended by a suspension element. The suspension element is formed of flexible material to allow positive and negative excursion of the passive radiator. However, like a spring, a flexible suspension element can only be physically stretched so far (i.e., to the positive (+d) and negative (−d) excursion limits). At a given frequency where the output from the passive radiator dominates sound pressure output from the system of active and passive drivers, applying a voltage to the active drivers which exceeds the positive (+d) and negative (−d) excursion limits of the passive radiator causes audio clipping to occur. Clipping is audible distortion in the sound pressure output caused by driving the passive radiator into its minimum or maximum excursion. Signal beyond these limits is cut-off (i.e., clipped), causing the distortion.

Example techniques may involve controlling a passive radiator. Such control may involve predicting, via a forward prediction model, excursion of a passive radiator caused by playback of audio content by one or more active speakers. A forward prediction model may be based on the linear relationship between the voltage applied to one or more active drivers and excursion of a passive driver. When certain portions of the audio content are predicted to cause clipping, the audio content is modified to control the passive radiator to an excursion that is at or below the excursion limit. In particular, the level(s) of those portions of the audio content that are predicted to cause clipping are reduced. Alternatively, other techniques such as modifying the phase of the input signal may also be used to limit excursion. Such modification causes less voltage to be applied to the active speakers, which ultimately causes less movement of the active speakers. Given less movement of the active speakers, less air is displaced and the passive radiator does not move to the extent predicted. Such control may help prevent audible clipping artifacts.

Feedback may further improve control of the radiator. When the one or more active speakers play back the audio content (with portions modified to limit excursion of the passive radiator), a sensor may measure excursion of the passive radiator. Predicted excursion (e.g., from a forward prediction model) is compared against measured excursion for various portions of the audio content (e.g., for respective samples or sets of samples). Differences between the predicted excursion and measured excursion can be provided as corrective feedback to the forward prediction model parameters. This feedback may cause adjustments to the forward prediction model, which may help to minimize error in the model.

As noted above, example techniques may involve controlling a passive radiator. A first implementation may include a playback device buffering successive samples of audio content; for sets of one or more buffered samples, predicting, via a forward prediction model, excursion of a passive radiator caused by playback of the respective set of buffered samples by one or more active speakers; limiting excursion of the passive radiator to less than an excursion limit when certain sets of buffered samples are predicted to cause the passive radiator to move beyond the excursion limit; playing back the successive samples of the modified audio content via the one or more active speakers; measuring excursion of the passive radiator when sets of buffered samples are played back via the one or more active speakers; for sets of one or more samples, determining respective differences between the predicted excursion and the measured excursion; and adjusting the forward prediction model to offset determined differences between the predicted excursion and the measured excursion.

A second implementation may include a playback device comprising a buffer to buffer successive samples of audio content; a forward prediction model to predict, for sets of one or more buffered samples, excursion of a passive radiator caused by playback of the respective set of buffered samples by one or more active speakers; a limiter to limit excursion of the passive radiator to less than an excursion limit when certain sets of buffered samples are predicted to cause the passive radiator to move beyond the excursion limit; an audio stage to play back the successive samples of the modified audio content via the one or more active speakers; a sensor to measure excursion of the passive radiator when sets of buffered samples are played back via the one or more active speakers; and a processor to determine respective differences between the predicted excursion and the measured excursion and adjust the forward prediction model to offset determined differences between the predicted excursion and the measured excursion.

Each of the these example implementations may be embodied as a method, a device configured to carry out the implementation, a system of devices configured to carry out the implementation, or a non-transitory computer-readable medium containing instructions that are executable by one or more processors to carry out the implementation, among other examples. It will be understood by one of ordinary skill in the art that this disclosure includes numerous other embodiments, including combinations of the example features described herein. Further, any example operation described as being performed by a given device to illustrate a technique may be performed by any suitable devices, including the devices described herein. Yet further, any device may cause another device to perform any of the operations described herein.

While some examples described herein may refer to functions performed by given actors such as "users" and/or other entities, it should be understood that this description is for purposes of explanation only. The claims should not be interpreted to require action by any such example actor unless explicitly required by the language of the claims themselves.

II. Example Operating Environment

FIG. 1 illustrates an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102, 104, 106, 108, 110, 112, 114, 116, 118, 120, 122, 124, control devices 126 and 128, a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
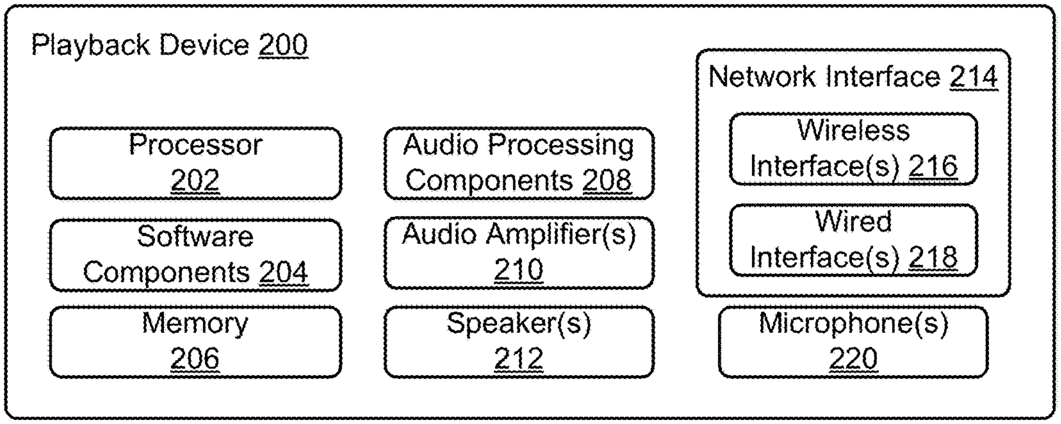
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The audio processing components 208 and the audio amplifier(s) 210 may be referred to as an audio stage.

The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
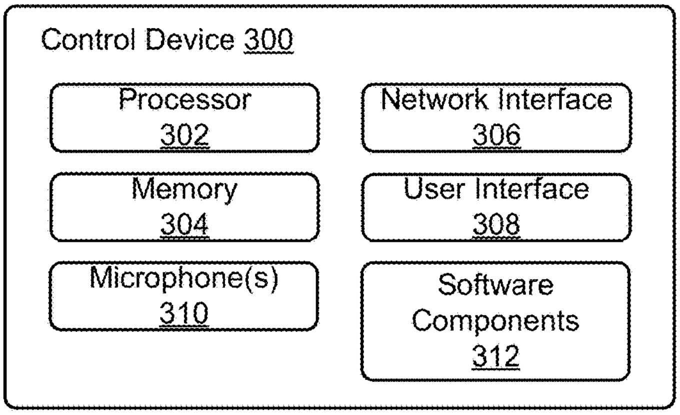
FIG. 3 shows a functional block diagram of an example control device.

FIG. 3 shows a functional block diagram of an example control device 300 that may be configured to be one or both of the control devices 126 and 128 of the media playback system 100. Control device 300 may also be referred to as a controller 300. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™ iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
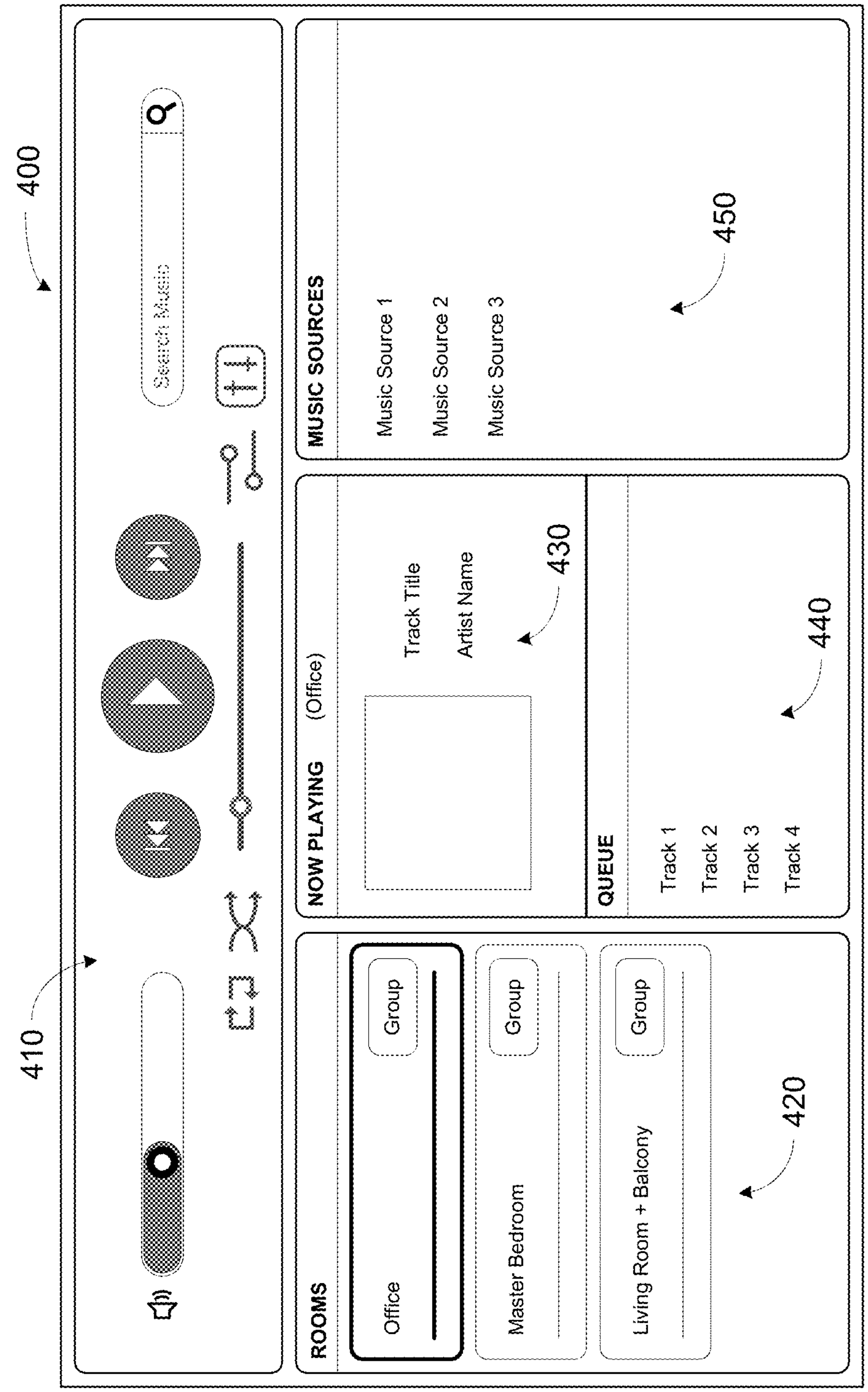
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The controller interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the controller interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the controller interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device. Playback of such a playback queue may involve one or more playback devices playing back media items of the queue, perhaps in sequential or random order.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g., according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

e. Example Playback Device

Figure 5A:
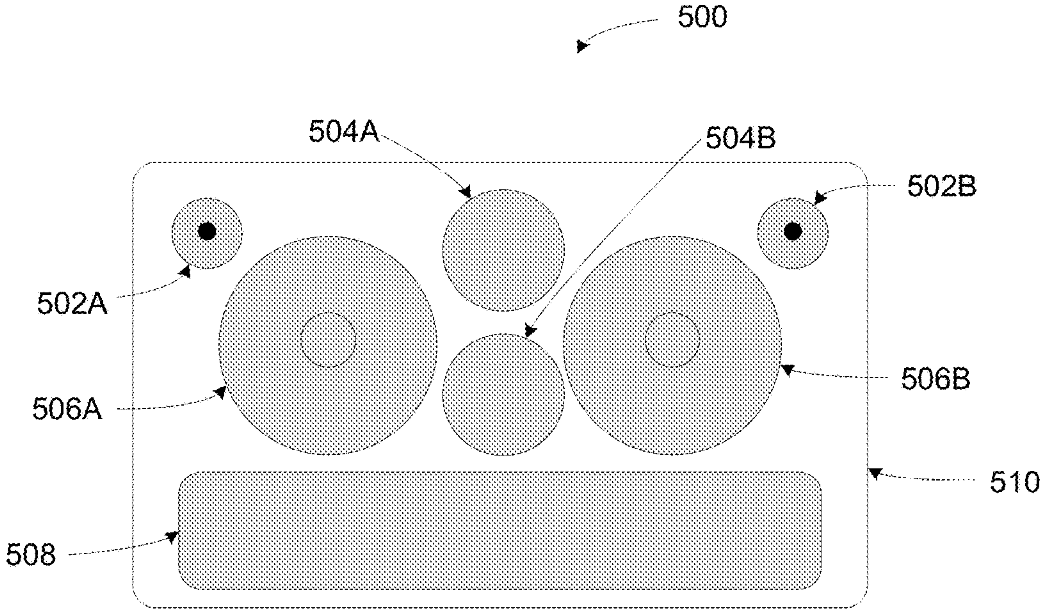
FIG. 5A shows a first view of an example playback device, according to example implementations.

FIG. 5A shows an example playback device 500. Playback device 500 includes active drivers (a.k.a. "speakers") 502A, 502B, 504A, 504B, 506A, and 506B. In particular, active drivers 502A and 502B are tweeters, active drivers 504A and 504B are mid-range speakers, and active drivers 506A, and 506B are woofers. Playback device 500 also includes a passive radiator 508. Active drivers 502A, 502B, 504A, 504B, 506A, and 506B and passive radiator 508 (and possibly other components not shown, such as those described in FIG. 2) are mounted in a sealed enclosure 510.

In operation, one or more amplifiers (e.g., audio amplifiers 210 of FIG. 2) may drive active drivers 502A, 502B, 504A, 504B, 506A, and 506B to cause these active drivers to produce audio. In particular, active drivers 502A, 502B, 504A, 504B, 506A, and 506B may include respective voice coils and magnetic assemblies that convert electric signals into sound by moving respective suspended speaker cones. Movement of the suspended speaker cones creates internal positive and negative air pressure in the sealed enclosure 510. Positive and negative air pressure in the sealed enclosure 510 causes the passive radiator 508 to move outwards and inwards, respectively.

Figure 5B:
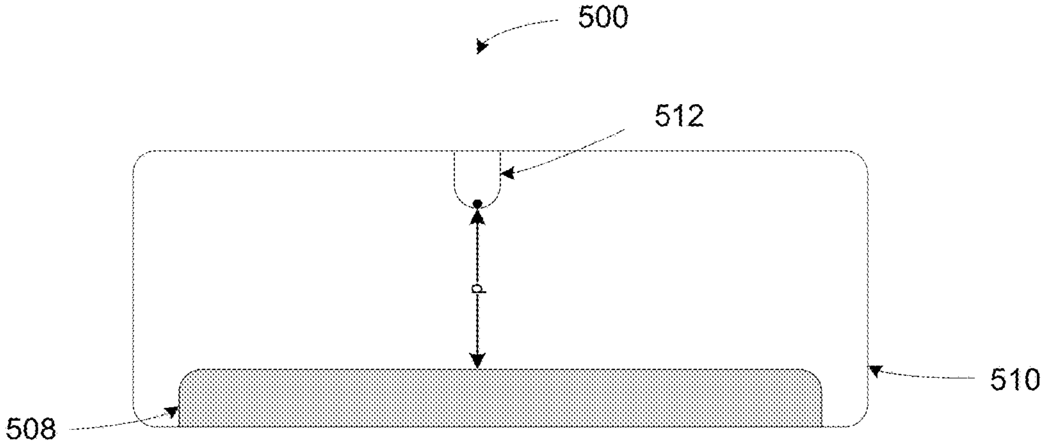
FIG. 5B shows a second view of the example playback device, according to example implementations.

FIG. 5B shows a cut-away top view of playback device 500. In particular, FIG. 5B shows passive radiator 508 in sealed enclosure 510. Also mounted in sealed enclosure 510 is a sensor 512. As shown, sensor 512 is oriented towards passive radiator 508 to measure inward and outward excursion of passive radiator 508.

Sensor 512 may be implemented using various types of sensors. For instance, sensor 512 may include an optical sensor with an optical transmitter and receiver. The optical transmitter (e.g. a LED) reflects light off of the passive radiator 508 and the optical receiver detects the reflected light. Time-of-flight of the light indicates excursion of the passive radiator 508.

In other implementations, sensor 512 may be implemented with an inductive sensor or a capacitive sensor. Variance in the inductance or capacitance indicates changing excursion of the passive radiator 508. On a passive radiator without a voice coil or magnetic assembly, inductive or capacitive sensing might not be interfered with in the same way that a voice coil or magnetic assembly would on an active driver.

In yet further implementations, sensor 512 may be implemented with an ultrasonic sensor. An ultrasonic sensor may include a transmitter impinging ultrasonic audio on the passive radiator and an ultrasonic detector. The ultrasonic sensor measures variation in received amplitude and/or frequency of the ultrasonic audio due to the movement of the passive radiator on the reflected ultrasonic transmission.

A capacitive sensor could be implemented by mounting parallel surfaces of conductive material to the passive radiator and the enclosure respectively. In such a configuration, movement of the passive radiator changes capacitance between the two surfaces. In one configuration, two sheets of acoustically transparent mesh could be mounted in front of the passive radiator, coupled to the enclosure and the passive radiator respectively. To implement an inductive sensor, a conductive material could be mounted to the passive radiator such that movement of the passive radiator induces current in a coil mounted on the enclosure (or vice versa).

Other types of sensors (e.g., an accelerometer) could be used as well.

III. Example System

Figure 6:
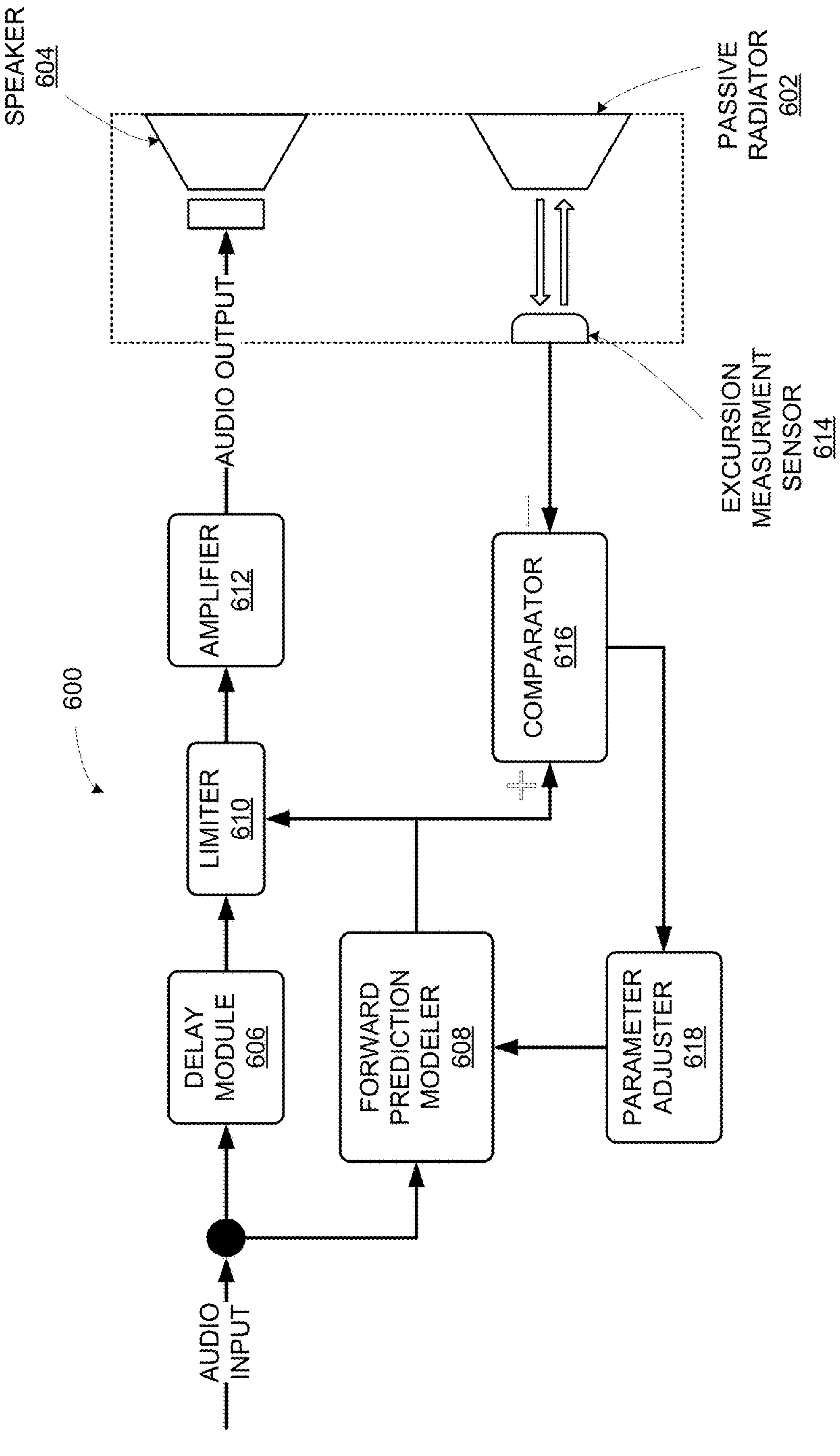
FIG. 6 shows a functional block diagram of an example control system, according to example implementations.

FIG. 6 shows a functional block diagram of an example system 600. Example system 600 may facilitate controlling a passive radiator 602 by controlling a speaker 604. System 600 may be implemented in a playback device, such as playback device 200 or playback device 500, among other examples. For instance, system 600 may be implemented using processor 202, software components 204, memory 206 and audio processing components 208. System 600 includes a delay module 606, a forward prediction modeler 608, a limiter 610, an amplifier 612, an excursion measurement sensor 614, a comparator 616, and a parameter adjuster 618. Other example system implementations might include a subset of such components and/or additional components.

As shown in FIG. 6, system 600 may receive audio input and provide audio output. The audio input may be any audio content such as music. In some examples, audio input includes one or more audio streams. An audio stream may include data representing multiple samples of digital audio content. The system may modify the audio input by introducing delay and/or changing portions of the audio input to produce the audio output.

Delay module 606 may receive the audio input. Delay module 606 may delay audio through system 600 to provide time for other components of system 600 to process the audio input. Delay module may include a buffer (e.g., a circular buffer), one or more filters, or another suitable component to introduce delay to the audio input.

Forward prediction modeler 608 may also receive the audio input. Using the audio input, the forward prediction modeler 608 may predict the position over time of a passive radiator (e.g., passive radiator 604, which might be implemented as passive radiator 508 of FIG. 5B). Samples of the audio input are proportional to respective voltage levels. For instance, when samples of the audio input are provided to an audio stage, gain (i.e., a multiplier) is applied to the samples to yield respective voltage levels. Then, when given voltages are applied to active driver(s) of a playback device, the driver(s) move inwards or outwards in proportion to the voltage levels. Changing voltage levels caused by multiple samples of different levels causes the active driver(s) to move back and forth to produce sound. As these drivers move, they displace air in a sealed enclosure in proportion to their excursion. This air displacement causes a passive radiator in the sealed enclosure to move in an approximately equal but opposite manner as the active drivers.

Figure 7:
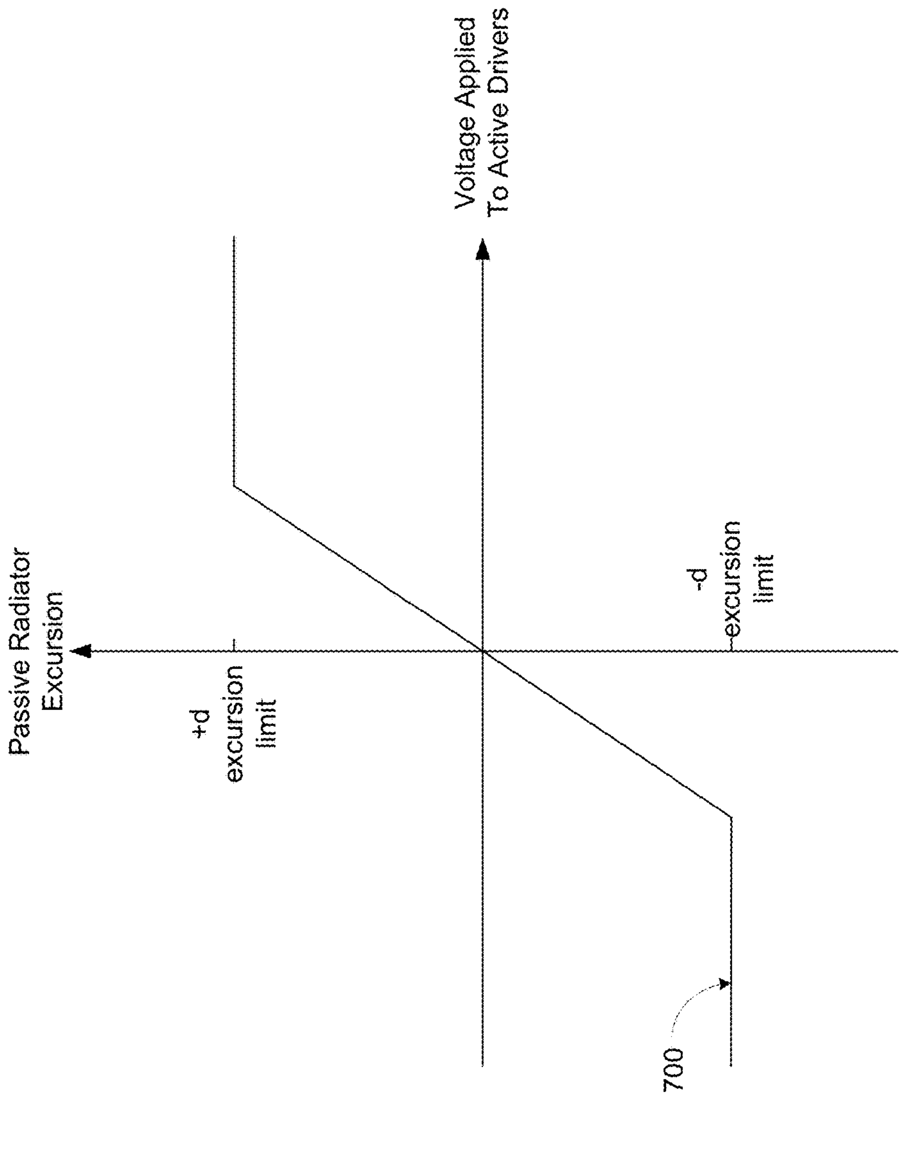
FIG. 7 shows a chart illustrating an example relationship between voltage applied to one or more active speakers and the resulting excursion of a passive radiator.

Given a known relationship between voltage applied to one or more active drivers and excursion of a passive radiator, the audio input (e.g., samples of an audio stream) may be used to predict the position of the passive driver. To illustrate, FIG. 7 shows a chart with voltage on the horizontal (x-) axis and exclusion of a passive radiator on the vertical (y-) axis. The chart includes a plot 700 illustrating a simplified relationship between voltage applied to one or more active drivers and excursion of a passive radiator. As shown, the example relationship between the voltage applied to one or more active drivers and excursion of a passive radiator (at a given frequency) can be approximated as linear, until the suspension limits are reached. To predict position of a passive radiator, the forward prediction modeler 608 may multiply one or more samples of the audio input by a known gain level of an audio stage to obtain one or more voltage levels corresponding to the one or more samples. Then, the forward prediction modeler 608 may predict the position of the passive radiator when the one or more samples are outputted by active drivers using a model (e.g., the relationship exemplified by plot 700).

Initially, a playback device having a given set of one or more audio drivers and one or more passive radiators may be characterized to determine a model for that playback device (or for that type (e.g., model) of playback device. Characterization may involve applying voltages to the audio drivers and measuring the excursion of the passive radiator caused by each voltage. A model can be generated from these data points (voltage vs. excursion) using a curve fitting algorithm or other suitable model generation algorithm.

As shown in FIG. 7, the relationship between the voltage applied to one or more active drivers and the resulting excursion of a passive radiator is approximately linear up to the positive (+d) and negative (−d) excursion limits. These are physical limits imposed by the construction of the passive radiator. Like an active speaker, a passive radiator includes a cone suspended by a flexible material known as a spider. The spider is flexible to allow positive and negative excursion of the passive radiator. However, like a spring, a spider can only be stretched so far (i.e., to the positive (+d) and negative (−d) excursion limits). When voltage exceeding the positive (+d) and negative (−d) excursion limits is applied to the active driver(s), clipping occurs. Clipping is distortion in the audio output caused by driving the passive radiator beyond its minimum or maximum excursion. Any signal beyond these limits is cut-off, causing the distortion.

Referring back to FIG. 6, the delay module 606 and forward prediction modeler 608 may provide the delayed audio input and predicted excursion to a limiter 610. When a given sample (or set of samples) of the audio input is predicted to cause the passive radiator to move beyond the positive (+d) or negative (−d) excursion limit, the limiter 610 may reduce the levels of the given sample(s). Such reduction reduces the voltages ultimately applied to the speaker 604 via the amplifier 612 and thus also the excursion of the passive radiator. Accordingly, this reduction may avoid clipping when the passive radiator 602 would have otherwise hit one of the excursion limits. A limiter is used in this example, but alternative audio signal processing functions could be substituted, such as compression, to control excursion of the passive radiator 602.

Figure 8:
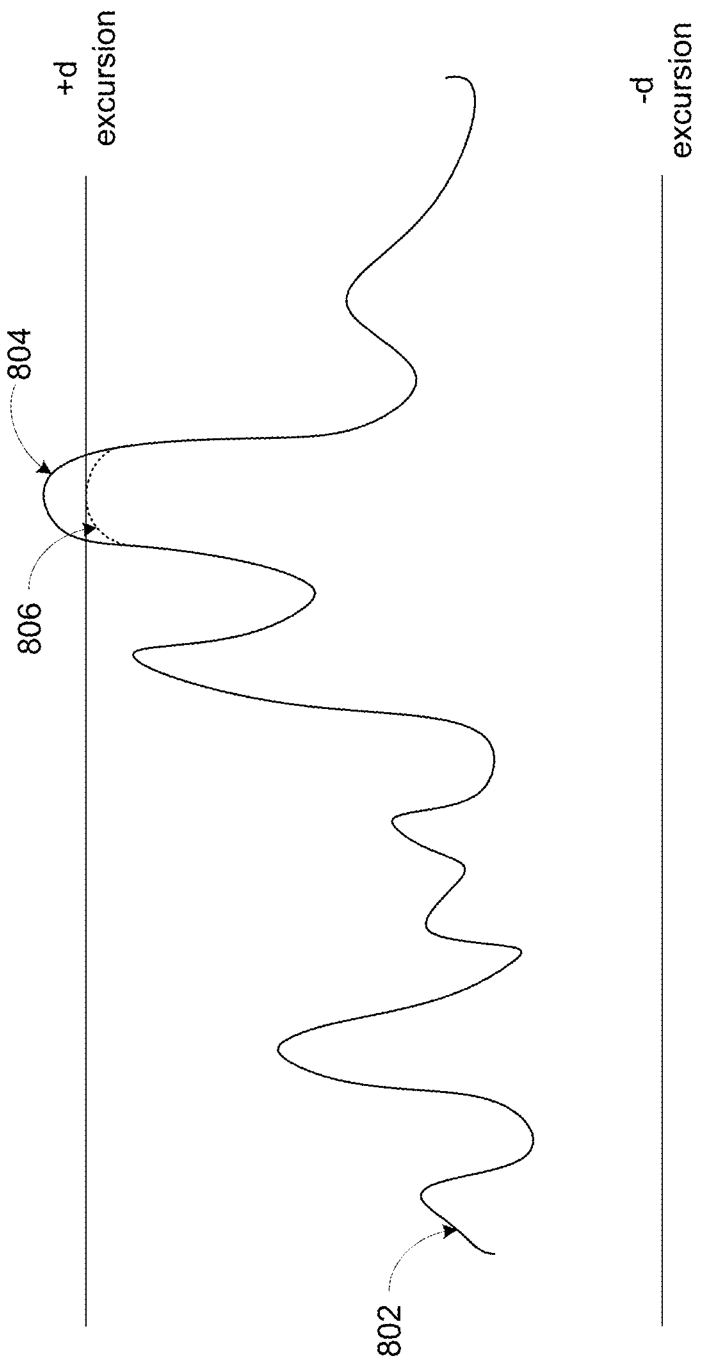
FIG. 8 shows a chart illustrating example waveforms of audio content, according to example implementations.

To illustrate, FIG. 8 shows a chart with an example waveform 802 representing predicted excursion of a passive radiator generated by an audio signal (e.g., a data stream of samples representing audio content). As shown, most of the waveform 802 is predicted to cause the passive radiator to vary between the +d and −d excursion limits. However, a portion 804 of the waveform is predicted to exceed the +d excursion limit. To avoid clipping, the limiter 606 may reduce the level of the signal when it would have exceed the +d excursion limit. For instance, the limiter 606 may modify samples of the delayed audio input that correspond to the portion 804 to produce the modified waveform 806.

As shown in FIG. 8, the limiter 610 might not merely reduce respective levels of samples that are predicted to exceed the excursion limit beyond the excursion limit, but instead smooth the waveform over the duration that the waveform is predicted to exceed the excursion limit. Such adjustment is facilitated by the forward-looking nature of the forward prediction modeler 604. For example, if the forward prediction modeler 608 predicts that 20 consecutive samples are predicted to exceed the excursion limit from time $t_1$ to $t_2$, then the limiter 610 may smooth the waveform between a time before $t_0$ before $t_1$ and a time $t_3$ after $t_2$ as shown with modified waveform 806.

Delayed (and possibly modified) audio (e.g., samples) from the limiter 606 are provided as output to the amplifier 612. Amplifier 612 drives speaker 604 (which may represent multiple speakers, such as active drivers 502A, 502B, 504A, 504B, 506A, and/or 506B). Air displacement caused by playback of the amplified audio output by the speaker 604 causes excursion of the passive radiator 602.

As playback of different samples cause the passive radiator to move to various distances, an excursion measurement sensor 614 measures the excursion of the passive radiator. In some instances, the excursion measurement sensor 614 may perform a measurement for each sample (e.g., 44.1 k measurements per second for audio sampled at 44.1 kHz). Alternatively, the excursion measurement sensor 614 may measure excursion at a higher or lower rate than the sample rate. Excursion measurement sensor 614 may be implemented as sensor 512 of FIG. 5B, among other examples.

Actual excursion of the passive radiator may differ from the predicted excursion. Such variation may be caused by environment conditions (e.g., temperature and humidity), material degradation or aging (e.g., "breaking-in" of the speaker spiders), or manufacturing variances, among other possible factors. The comparator 616 may compare the measured excursion and the predicted excursion for sets of samples. Such comparisons may yield respective differences between the measured excursion and the predicted excursion for the sets of samples.

Parameter adjuster 618 may receive output from comparator 616 (i.e., determined differences between measured excursion and the predicted excursion for one or more sets of samples). Parameter adjuster 618 may adjust parameters of the model used by forward prediction modeler 608 using the output from comparator 616 as feedback. For instance, as a passive radiator "breaks-in," the spider may become more easily flexible such that a given amount of air displacement causes more excursion (as the passive radiator doesn't oppose the force of the air displacement quite as much). In such a circumstance, the parameter adjuster 618 may adjust the model so that a given voltage is predicted to cause greater excursion of the passive radiator.

IV. Example Techniques to Control a Passive Radiator

Figure 9:
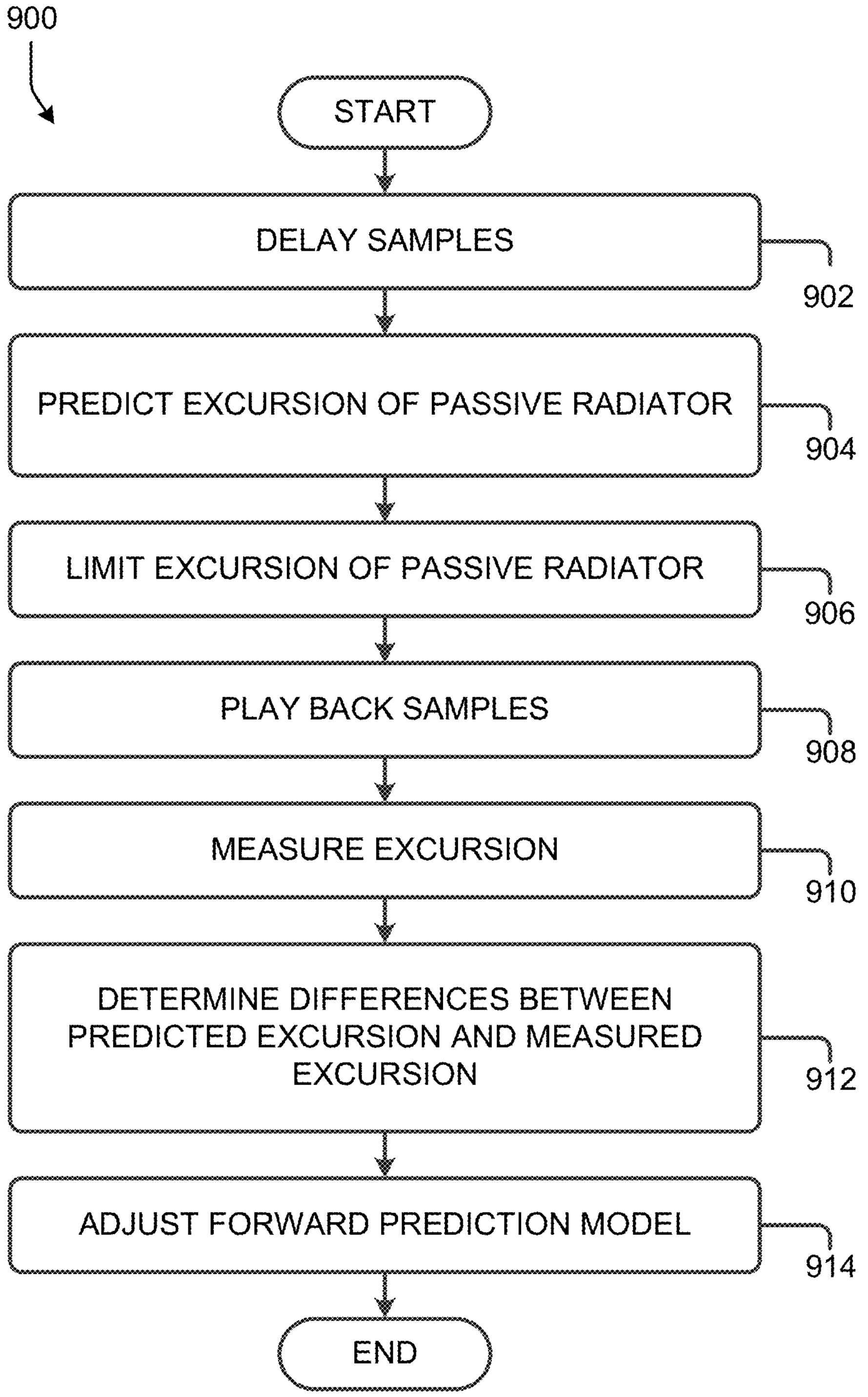
FIG. 9 shows a technique to control a passive radiator, according to example implementations.

Implementations 900 shown in FIG. 9 presents example embodiments of techniques described herein. These example embodiments that can be implemented within an operating environment including, for example, the media playback system 100 of FIG. 1, one or more of the playback device 200 of FIG. 2, one or more of the control device 300 of FIG. 3, one or more of the playback devices of FIGS. 5A and 5B, as well as other devices described herein and/or other suitable devices. Further, operations illustrated by way of example as being performed by a media playback system can be performed by any suitable device, such as a playback device or a control device of a media playback system. Implementations 900 may include one or more operations, functions, or actions as illustrated by one or more of blocks shown in FIG. 9. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the implementations disclosed herein, the flowcharts show functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache, and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the implementations disclosed herein, each block may represent circuitry that is wired to perform the specific logical functions in the process.

As discussed above, embodiments described herein involve controlling a passive radiator. FIG. 9 illustrates an example implementation 900 by which a playback device controls a passive radiator using excursion prediction.

a. Delay Samples

At block 902, implementation 900 involves delaying samples of audio content. For instance, a playback device (such as playback device 500) may buffer successive samples of audio content (e.g., music). Within example implementations, delaying samples of audio content involves a delay module (e.g., delay module 606) introducing delay to audio content using a buffer or filter. In some examples, the audio content includes one or more audio streams. An audio stream may include data representing multiple samples of digital audio content.

Delaying the audio content may provide time for the samples of audio content to be processed and possibly adjusted. As noted above, by adjusting levels of audio samples to be played back, a playback device can, in effect, control excursion of a passive radiator by controlling excursion of the active drivers playing back the audio samples.

b. Predict Excursion of Passive Radiator

At block 904, implementation 900 involves predicting excursion of a passive radiator. As noted above, excursion of a passive radiator may be caused by playback of the audio content by one or more active speakers. In particular, playback of the audio content by one or more active speakers mounted in a sealed enclosure may cause air displacement that moves a passive radiator. A playback device (e.g., playback device 500) may include one or more active speakers (e.g., active drivers 502A, 502B, 504A, 504B, 506A, and/or 506B) and a passive radiator (e.g., passive radiator 508) mounted in a sealed enclosure (e.g., enclosure 510). The playback device may predict excursion of the passive radiator caused by playback of the audio content by the one or more active speakers.

In example implementations, the playback device may use a forward prediction model (e.g., forward prediction modeler 608) to predict excursion of the passive radiator caused by playback of the respective set of buffered samples by the one or more active speakers. Samples of an audio content correspond to respective sound pressure levels. When a known gain is applied, these levels correspond to respective voltage levels. A forward prediction model may map voltage level to excursion. Given a known delay and a known sample rate (e.g., 44.1 kHz for CD quality audio), the playback device may determine when each sample of the audio content will be played. Furthermore, given a forward prediction model, the playback device may predict the excursion caused by playback of that sample at the determined time. As such, the playback device may predict excursion over time for samples of the audio content before the samples of audio content are played back. FIG. 7 illustrates an example model.

Given known forward prediction models of other playback devices, the playback device may also predict excursion of passive radiators mounted in respective enclosures of other playback devices. For instance, the playback device may predict excursion of passive radiators of other playback devices of the same type (model) or perhaps a different type. Alternatively, another computing device may predict excursion of the passive radiators.

c. Limit Excursion of Passive Radiator

In FIG. 9, at block 906, implementation 900 involves limiting excursion of the passive radiator. For instance, the playback device may limit excursion of the passive radiator less than an excursion limit when certain sets of delayed samples are predicted to cause the passive radiator to move beyond the excursion limit. The excursion limits may include positive (+d) and negative (−d) displacement limits corresponding to physical inward and outward excursion limits.

In example implementations, a limiter (e.g., limiter 610) or compressor may limit excursion of the passive radiator by modifying the audio content to lower sound pressure levels of the buffered samples that are predicted to cause the passive radiator to move beyond the excursion limit. Adjusting levels of audio samples to be played back by active speakers effectively controls excursion of a passive radiator since the lowered levels of the samples causes the less movement of the active drivers(s), which displaces less air to move the passive radiator. FIG. 8 illustrates example excursion limiting. When certain samples are predicted to move the passive radiator within the excursion limits, the playback device might not modify those samples. Alternatively, some samples might be modified (e.g., to smooth the limited audio signal).

d. Play Back Samples

Referring again to FIG. 9, at block 908, implementation 900 involves playing back samples. For instance, the playback device may play back the successive samples of the audio content via one or more active speakers (e.g., active drivers 502A, 502B, 504A, 504B, 506A, and/or 506B). As noted above, some samples of the audio content may have been modified to control the passive radiator (i.e., to limit excursion).

In some cases, the playback device may be part of a grouping of playback devices, such as a bonded zone or zone group. In such cases, playing back first audio in the given environment may involve playing audio in synchrony with other playback devices in the grouping. For instance, playback devices 104, 106, 108, and 110 may play back respective channels of first audio that includes surround sound (e.g., home theater) audio. As another example, playback devices 104, 106, 108, 110, 112 and 114 may be joined into a zone group to play music in synchrony. In such cases, the playback device may transmit the modified audio content to other playback devices in the grouping via a network interface. These other playback devices may then play back the modified audio content in synchrony with the playback device.

For instance, in some implementations, a given playback device in a grouping of playback devices may operate as a designated player (e.g., a group coordinator) for the grouping of playback devices. As the designated player, the given playback device may receive audio content for playback by the group, buffer the content, predict excursion of respective passive radiators of the playback devices in the grouping, and limit excursion of these passive radiators by modifying the buffered audio content. The designated player may then transmit the modified audio content to the other playback devices in the grouping to facilitate synchronous playback of that audio content.

In other implementations, each playback device in a grouping may receive audio content for playback by the grouping (perhaps from a group coordinator or from a remote source), buffer the audio content, predict excursion of its respective passive radiator(s), and limit excursion of this passive radiator by modifying the buffered audio content.

e. Measure Excursion

At block 910, implementation 900 involves measuring excursion of the passive radiator. For instance, a sensor, such as sensor 512 of FIG. 5B or excursion measurement sensor 614 of FIG. 6, may measure excursion of the passive radiator (e.g., passive radiator 508 of FIGS. 5A and 5B or passive radiator 604 of FIG. 6). As noted above, air displacement caused by playback of the samples by the active drivers causes excursion of the passive radiator.

As playback of different samples cause the passive radiator to move to various distances, an excursion measurement sensor (e.g., sensor 512 of FIG. 5B) measures the displacement of the passive radiator. In some instances, the sensor may perform a measurement for each sample. Alternatively, the sensor may measure excursion at a higher or lower rate than the sample rate. For instance, the sensor may measure at half the sample rate (e.g., 22.05 k measurements per second for audio sampled at 44.1 kHz). Other sampling rates are possible as well.

f. Determine Differences Between Predicted Excursion and Measured Excursion

At block 912, implementation 900 involves determining differences between the predicted excursion and measured excursion. For instance, the playback device may determine respective differences between the predicted excursion and measured excursion for sets of samples after each set has been played back.

As noted above, actual excursion of the passive radiator may differ from the predicted excursion. Variation may be caused by changing environment conditions (e.g., temperature and humidity), material degradation (e.g., "breaking-in" of the active and passive speakers), or manufacturing variances, among other possible factors. In some implementations, a comparator (e.g., comparator 616 of FIG. 5) may compare the measured excursion and the predicted excursion for the sets of samples to determine respective differences between the measured excursion and the predicted excursion for the sets of samples.

For instance, for a given sample, the forward prediction model might predict an excursion of +6.3 millimeters (mm). The measured excursion might be +7.1 mm. In this example, the difference between the predicted excursion and the measured excursion is 0.8 mm.

g. Adjust Forward Prediction Model

In FIG. 9, at block 908, implementation 900 involves adjusting the forward prediction model. For instance, the playback device may adjust the forward prediction model to offset determined differences between the predicted excursion and the measured excursion. In other words, the playback device may use determined differences between the predicted excursion and the measured excursion as negative feedback to reduce error in the forward prediction model.

As noted above, excursion of the passive radiator at or above an excursion limit may cause clipping. Physical excursion limits may change over time due to changing environment conditions (e.g., temperature and humidity), material degradation (e.g., "breaking-in" of the active and passive speakers). In some cases, the playback device may detect clipping of the passive radiator at physical excursions that are under the excursion limit set by a limiter (e.g., limiter 610 of FIG. 6). In other words, even though the limiter adjusts samples to limit excursion of the passive radiator to certain excursion limits in an attempt to avoid excursion, clipping occurs because the physical excursion limits of the passive radiator are different from the excursion limits set in the limiter.

When such clipping is detected, the playback device may responsively lessen the excursion limits. Such lessening may cause the limiter to adjust samples of the audio content to lower levels, thereby controlling the passive radiator to less displacement. Such control may avoid clipping of the radiator.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

(Feature 1) A method comprising buffering successive samples of audio content; for sets of one or more buffered samples, predicting, via a forward prediction model, excursion of a passive radiator caused by playback of the respective set of buffered samples by one or more active speakers; limiting excursion of the passive radiator below an excursion limit when certain sets of buffered samples are predicted to cause the passive radiator to exceed the excursion limit, wherein limiting excursion of the passive radiator comprises modifying the audio content to lower sound pressure levels of the buffered samples that are predicted to cause the passive radiator to move beyond to the excursion limits; playing back the successive samples of the modified audio content via the one or more active speakers; measuring excursion of the passive radiator when sets of buffered samples are played back via the one or more active speakers; for sets of one or more samples, determining respective differences between the predicted excursion and the measured excursion; and adjusting the forward prediction model to offset determined differences between the predicted excursion and the measured excursion.

(Feature 2) The method of feature 1, wherein the one or more active speakers and the passive radiator are mounted in a sealed enclosure.

(Feature 3) The method of feature 1, wherein predicting, via the forward prediction model, excursion of the passive radiator caused by playback of the respective set of buffered samples by the one or more active speakers comprises for the sets of one or more buffered samples, determining sound pressure levels of the buffered samples, wherein the determined sound pressure levels correspond to respective signal voltages applied to the one or more active speakers; and predicting respective excursions of the passive radiator caused by each signal voltage when applied to the one or more active speakers.

(Feature 4) The method of feature 1, wherein an optical sensor is oriented at the passive radiator, the optical sensor comprising an optical transmitter and an optical receiver, wherein measuring excursion of the passive radiator when sets of buffered samples are played back via the one or more active speakers comprises causing an optical sensor to measure respective times-of-flight of light emitted by an optical transmitter and reflected off the passive radiator to an optical receiver.

(Feature 5) The method of feature 1, wherein an acoustically-transparent conductive mesh is mounted in front of the passive radiator and a capacitive sensor, and wherein measuring excursion of the passive radiator when sets of buffered samples are played back via the one or more active speakers comprises causing the capacitive sensor to measure variation in capacitance in the between the acoustically transparent conductive mesh and a second conductive surface.

(Feature 6) The method of feature 1, further comprising detecting repeated clipping of the passive radiator at respective excursions that are under the excursion limit; and responsively, lessening the excursion limit (Feature 7) The method of feature 1, wherein the playback device further comprises a network interface, wherein the playback device is a first playback device, and wherein the operations further comprise transmitting, via the network interface to one or more second playback devices, the modified audio content; and wherein playing back the successive samples of the modified audio content comprises playing back the successive samples of the modified audio content in synchrony with the one or more second playback devices.

(Feature 8) A tangible, non-transitory computer-readable medium having stored therein instructions executable by one or more processors to cause a device to perform the method of any of features 1-7.

(Feature 9) A playback device configured to perform the method of any of features 1-7.

(Feature 10) A media playback system configured to perform the method of any of features 1-7.

(Feature 11) A system comprising: a buffer to buffer successive samples of audio content; a forward prediction model to predict, for sets of one or more buffered samples, excursion of a passive radiator caused by playback of the respective set of buffered samples by the one or more active speakers; a limiter to limit excursion of the passive radiator to less than an excursion limit when certain sets of buffered samples are predicted to cause the passive radiator to move beyond the excursion limit; an audio stage to play back the successive samples of the modified audio content via the one or more active speakers; a sensor to measure excursion of the passive radiator when sets of buffered samples are played back via the one or more active speakers; and a processor to determine respective differences between the predicted excursion and the measured excursion and adjust the forward prediction model to offset determined differences between the predicted excursion and the measured excursion.

(Feature 12) A playback device comprising the system of feature 11.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A playback device comprising:
a network interface;
an audio stage comprising one or more amplifiers;
a speaker driver;
one or more processors; and
a housing, the housing carrying at least the network interface, the audio stage, the speaker driver, the one or more processors and data storage having stored therein instructions executable by the one or more processors to cause the playback device to perform operations comprising:
receiving, via the network interface, audio content;
generating an audio signal representing the audio content, wherein generating the audio signal comprises modifying portions of the audio content to limit excursion of the speaker driver to less than an excursion limit when a forward prediction model indicates that the portions of the audio content are predicted to cause the speaker driver to move beyond the excursion limit;
while playing back the generated audio signal via the audio stage, measuring excursion of the speaker driver;
generating a feedback signal based on the measured excursion; and
adjusting the forward prediction model based on the generated feedback signal.

2. The playback device of claim 1, wherein generating the feedback signal based on the measured excursion comprises generating a particular feedback signal representing differences between the measured excursion and excursion predicted by the forward prediction model.

3. The playback device of claim 2, wherein adjusting the forward prediction model comprises offsetting differences between the measured excursion and excursion predicted by the forward prediction model.

4. The playback device of claim 1, wherein the speaker driver is driven by the one or more amplifiers during playback.

5. The playback device of claim 1, wherein the speaker driver is a woofer configured to reproduce a bass frequency range of the audio content, and wherein the playback device further comprises one or more additional active speakers configured to reproduce a full-range of the audio content.

6. The playback device of claim 1, wherein the speaker driver is a passive radiator, and wherein the playback device further comprises one or more active speakers that are driven by the one or more amplifiers during playback.

7. The playback device of claim 6, wherein the housing is a sealed enclosure, and wherein the one or more active speakers and the passive radiator are mounted in the sealed enclosure.

8. A tangible, non-transitory computer-readable medium having stored therein instructions executable by one or more processors to cause a playback device to perform a method comprising:
receiving, via a network interface, audio content, wherein the network interface is carried in a housing of the playback device;
generating an audio signal representing the audio content, wherein generating the audio signal comprises modifying portions of the audio content to limit excursion of a speaker driver to less than an excursion limit when a forward prediction model indicates that the portions of the audio content are predicted to cause the speaker driver to move beyond the excursion limit, wherein the speaker driver is carried by the housing;
while playing back the generated audio signal via an audio stage comprising one or more amplifiers, measuring excursion of the speaker driver, wherein the audio stage is carried by the housing;
generating a feedback signal based on the measured excursion; and
adjusting the forward prediction model based on the generated feedback signal.

9. The tangible, non-transitory computer-readable medium of claim 8, wherein generating the feedback signal based on the measured excursion comprises generating a particular feedback signal representing differences between the measured excursion and excursion predicted by the forward prediction model.

10. The tangible, non-transitory computer-readable medium of claim 9, wherein adjusting the forward prediction model comprises offsetting differences between the measured excursion and excursion predicted by the forward prediction model.

11. The tangible, non-transitory computer-readable medium of claim 8, wherein the speaker driver is driven by the one or more amplifiers during playback.

12. The tangible, non-transitory computer-readable medium of claim 8, wherein the speaker driver is a woofer configured to reproduce a bass frequency range of the audio content, and wherein the playback device further comprises one or more additional active speakers configured to reproduce a full-range of the audio content.

13. The tangible, non-transitory computer-readable medium of claim 8, wherein the speaker driver is a passive radiator, and wherein the playback device further comprises one or more active speakers that are driven by the one or more amplifiers during playback.

14. The tangible, non-transitory computer-readable medium of claim 13, wherein the housing is a sealed enclosure, and wherein the one or more active speakers and the passive radiator are mounted in the sealed enclosure.

15. A method to be performed by a playback device comprising a housing carrying at least a network interface, an audio stage comprising one or more amplifiers, and a speaker driver, the method comprising:
receiving, via the network interface, audio content;
generating an audio signal representing the audio content, wherein generating the audio signal comprises modifying portions of the audio content to limit excursion of the speaker driver to less than an excursion limit when a forward prediction model indicates that the portions of the audio content are predicted to cause the speaker driver to move beyond the excursion limit;
while playing back the generated audio signal via the audio stage, measuring excursion of the speaker driver;
generating a feedback signal based on the measured excursion; and
adjusting the forward prediction model based on the generated feedback signal.

16. The method of claim 15, wherein generating the feedback signal based on the measured excursion comprises generating a particular feedback signal representing differences between the measured excursion and excursion predicted by the forward prediction model.

17. The method of claim 16, wherein adjusting the forward prediction model comprises offsetting differences between the measured excursion and excursion predicted by the forward prediction model.

18. The method of claim 15, wherein the speaker driver is driven by the one or more amplifiers during playback.

19. The method of claim 15, wherein the speaker driver is a woofer configured to reproduce a bass frequency range of the audio content, and wherein the playback device further comprises one or more additional active speakers configured to reproduce a full-range of the audio content.

20. The method of claim 19, wherein the speaker driver is a passive radiator, and wherein the playback device further comprises one or more active speakers that are driven by the one or more amplifiers during playback.

* * * * *